(12) United States Patent
Dawson et al.

(10) Patent No.: US 8,559,906 B2
(45) Date of Patent: Oct. 15, 2013

(54) SYSTEM AND METHOD FOR PROVIDING A CARBON NANOTUBE MIXER

(75) Inventors: Dale E. Dawson, Glen Burnie, MD (US); John X. Przybysz, Severna Park, MD (US); Maaz Aziz, College Park, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 23 days.

(21) Appl. No.: 13/168,684

(22) Filed: Jun. 24, 2011

(65) Prior Publication Data
US 2012/0326763 A1 Dec. 27, 2012

(51) Int. Cl.
*H04B 1/26* (2006.01)
*H04B 1/28* (2006.01)
*G06G 7/16* (2006.01)

(52) U.S. Cl.
USPC ........ 455/326; 455/333; 455/209; 455/252.1; 455/293; 327/359; 342/179; 257/347

(58) Field of Classification Search
USPC ............... 455/326, 333, 323, 293, 318, 325, 455/252.1, 255, 258, 209; 327/357, 327/355–361, 78–82, 562–563, 35; 342/179, 175; 257/347, 24, 40, 288, 257/365–366; 375/322
See application file for complete search history.

(56) References Cited

U.S. PATENT DOCUMENTS

| | | | | |
|---|---|---|---|---|
| 6,297,685 B1* | 10/2001 | Ewen et al. | | 327/513 |
| 6,339,318 B1* | 1/2002 | Tanaka | | 323/313 |
| 6,590,438 B1* | 7/2003 | Manku et al. | | 327/359 |
| 6,831,501 B1* | 12/2004 | Aude | | 327/538 |
| 7,164,897 B2* | 1/2007 | Manku et al. | | 455/293 |
| 7,366,484 B2* | 4/2008 | Sowlati | | 455/127.2 |
| 7,714,386 B2* | 5/2010 | Pesetski et al. | | 257/347 |
| 8,232,831 B2* | 7/2012 | Feng et al. | | 327/357 |
| 2008/0296562 A1* | 12/2008 | Murduck et al. | | 257/40 |
| 2010/0141325 A1* | 6/2010 | Bao et al. | | 327/355 |
| 2012/0182178 A1* | 7/2012 | Pesetski et al. | | 342/179 |

OTHER PUBLICATIONS

Baumgardner, James E., Inherent linearity in carbon nanotube field-effect transistors, American Inst. of Physics, (2007), pp. 1-3, Applied Physic's Letters 91, Linthicum, MD.

(Continued)

*Primary Examiner* — Pablo Tran
(74) *Attorney, Agent, or Firm* — Sean S. Wooden; Andrews Kurth, LLP

(57) ABSTRACT

An embodiment of a system and method provides a carbon nanotube transistor (CNT) mixer with a low local oscillator power requirement and no inter-modulation products. Specifically, an embodiment of the system and method provides two kinds of device current-voltage (I-V) characteristics on the same integrated circuit: exponential and linear. The CNT I-V characteristics support both the ideal exponential control characteristic (determined by physics constants) and the ideal linear control characteristic (also determined by physics constants), resulting in an ideal multiplier. In other words, the CNT mixer is mathematically equivalent to an ideal multiplier. Such an ideal multiplier can be used as a mixer with low local oscillator power requirement and virtually no inter-modulation products.

23 Claims, 5 Drawing Sheets

(56) References Cited

OTHER PUBLICATIONS

Gilbert, Barrie, A New Wide-Band Amplifier Technique, IEEE Journal of Solid-State Circuits, Dec. 1968, pp. 353-365, vol. SC-3, No. 4.
Gilbert, Barrie, A Precise Four-Quadrant Multiplier with Subnanosecond Response, IEEE Journal of Solid-State Circuits, Dec. 1968, pp. 365-373, vol. SC-3, No. 4.
Chapter 3, Signal Processing with Nanotube Stochastic Resonance, pp. 40-77, Nov. 2006.
Zetterling, Prof. Carl-Mikael, Semiconductor Components, Annual Report 2008, pp. 82-89.

* cited by examiner

SYSTEM AND METHOD FOR PROVIDING A CARBON NANOTUBE MIXER

BACKGROUND

Current mixer (i.e., receiver) techniques are based on diode rings, field-effect transistor (FET) resistive switches, and differential pairs of transistors. These current mixer techniques use a local oscillator to switch the radio frequency (RF) on and off, and need the local oscillator to be larger than the RF to ensure that the local oscillator dominates the RF signal simultaneously present in the diode ring or FET resistive switch. The Fourier analysis of the RF signal switched on and off at the local oscillator rate yields an intermediate frequency (IF) as one of the components, thus giving mixing action. With multiple RF frequencies present, additional Fourier components may arise, more than just difference frequencies, and these additional components can be near in frequency to the IF. These additional components mask the desired IF signals and are generally referred to as spurious signals. Minimizing the effect of these spurs requires still more local oscillator power. What is desired is an ideal multiplier or mixer with the ability to reduce local oscillator drive requirements in radar systems so as to reduce the power consumption and the number of parts in the local oscillator chain.

The Gilbert multiplier circuit (also referred to as the Gilbert multiplier or Gilbert cell mixer) is mathematically an ideal multiplier. It is based on transistors with an exponential transfer characteristic in a cross-coupled differential pair configuration and on transistors with a linear transfer characteristic in the emitter current sources. The Gilbert multiplier is described, for example, in B. Gilbert, "A precise four quadrant multiplier with subnanosecond response," IEEE J. Solid-State Circuits, December 1968, pp. 365-373 and B. Gilbert, "A new wide-band amplifier technique," IEEE J. Solid-State Circuits, December 1968, pp. 352-365, which are incorporated herein by reference. However, technologies that have been available for the last several decades, such as bipolar junction transistors (BJTs), complementary metal oxide semiconductor (CMOS) transistors, heterojunction bipolar transistors (HBTs), high electron mobility transistors (HEMTs), and silicon germanium (SiGe) transistors, do not satisfy both operating regions required by the Gilbert multiplier circuit. For example, BJTs, HBTs, and SiGe transistors satisfy the exponential control characteristic, but they do not satisfy the linear control characteristic. Tricks are used to try to achieve a linear control characteristic from BJTs, HBTs, and SiGe transistors but in the end these tricks compromise linearity and do not achieve exceptionally low inter-modulation products. CMOS transistors and HEMTs do not have either an exponential or a linear control characteristic in pure form and do not achieve exceptionally low inter-modulation products in the Gilbert circuit.

SUMMARY

An embodiment of a system provides a carbon nanotube transistor (CNT) mixer with a low local oscillator power requirement and no inter-modulation products. The system includes a modified Gilbert multiplier circuit that includes a plurality of sub-threshold CNT devices having exponential control characteristics, and a plurality of above-threshold CNT devices having linear control characteristics. The plurality of sub-threshold CNT devices are increased in periphery by a scale factor so that the plurality of sub-threshold CNT devices have relatively large periphery of channel widths and the plurality of above-threshold CNT devices have relatively small periphery of channel widths.

An embodiment of a method provides a CNT mixer with a low local oscillator power requirement and no inter-modulation products. The method includes providing a modified Gilbert multiplier circuit that includes providing a plurality of sub-threshold CNT devices having exponential control characteristics, and providing a plurality of above-threshold CNT devices having linear control characteristics. The plurality of sub-threshold CNT devices are increased in periphery by a scale factor so that the plurality of sub-threshold CNT devices have relatively large periphery of channel widths and the plurality of above-threshold CNT devices have relatively small periphery of channel widths.

An embodiment of a CNT mixer has a low local oscillator power requirement and no inter-modulation products. The CNT mixer includes a modified Gilbert multiplier circuit, which includes a plurality of sub-threshold CNT devices having exponential control characteristics, and a plurality of above-threshold CNT devices having linear control characteristics. The plurality of sub-threshold CNT devices are increased in periphery by a scale factor so that the plurality of sub-threshold CNT devices have relatively large periphery of channel widths and the plurality of above-threshold CNT devices have relatively small periphery of channel widths.

DESCRIPTION OF THE DRAWINGS

The detailed description will refer to the following drawings, wherein like numerals refer to like elements, and wherein.

DETAILED DESCRIPTION

Figure 1:
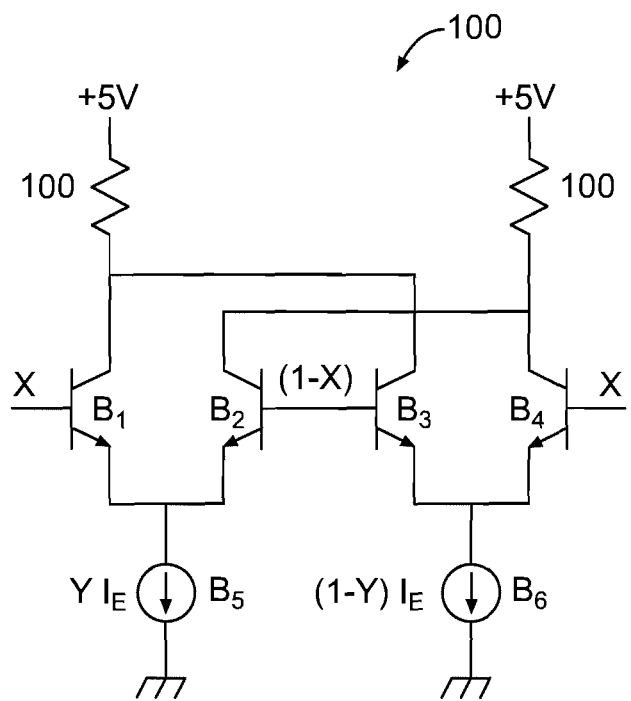
FIG. 1 illustrates active devices, e.g., bipolar junction transistors (BJTs), in an original Gilbert multiplier circuit.

The design of a mixer is based on two factors, i.e., sensitivity and dynamic range. Sensitivity is the smallest signal that can be detected when it is the only signal present. Sensitivity depends on noise figure because the signal must rise above the noise floor. Dynamic range is the smallest signal that can be detected when there are many larger signals present. Dynamic range depends on linearity because nonlinearities will generate spurious inter-modulation products of the larger signals that mask the small signal.

In a busy signals environment, dynamic range can be more important than sensitivity. For example, a Global Hawk plane flying over Baghdad may receive the signal from a terrorist's cell phone above the noise floor. But there are so many other signals in that band that it may be impossible to sort out a single source for geolocation. It will depend on the linearity of the mixer.

The linearity of the mixer is commonly expressed in terms of third-order intercept point (IP3), a higher number being a higher dynamic range with no spurious signals. A mixer can achieve high IP3 if provided increased local oscillator drive. Therefore, the design tradeoff of the mixer is usually made according to how much local oscillator drive is available. A mixer's output is defined relative to a local oscillator. For example, a number of 8 dB (decibels, 10 log power ratio) means that the output of the mixer (IP3 number) is 8 dB higher than the local oscillator. If the output of the mixer relative to the local oscillator drive can be increased from 8 dB to a higher number, the dynamic range of the mixer can be improved.

In radar systems, large local oscillator drive is needed to achieve high IP3 mixer operation in the radar receiver section. Also, the local oscillator needs to have low phase noise. A clean local oscillator drive starts at low frequencies using quartz crystal oscillators as the high-quality, frequency-stable source. These oscillators typically operate at 100 MHz and must be multiplied up to GHz frequencies, requiring a chain of various kinds of chips to do so. Local oscillator amplifier chips, their power consumption, and their added phase noise present major design issues for a radar receiver.

An embodiment of a system and method provides a carbon nanotube transistor (CNT) mixer with a low local oscillator power requirement and no inter-modulation products. The CNT mixer is also referred to as a near-ideal Gilbert cell mixer or a perfectly linear mixer. Specifically, an embodiment of the system and method provides two kinds of device current-voltage (I-V) characteristics on the same integrated circuit: exponential and linear. The CNT I-V characteristics support both the ideal exponential control characteristic (determined by physics constants) and the ideal linear control characteristic (also determined by physics constants), resulting in an ideal multiplier (also referred to as a perfect multiplier). In other words, the CNT mixer is mathematically equivalent to an ideal multiplier. Such an ideal multiplier can be used as a mixer with low local oscillator power requirement and virtually no inter-modulation products.

An embodiment of the system and method for providing a CNT mixer with a low local oscillator power requirement and no inter-modulation products is an improvement upon the Gilbert multiplier circuit. An embodiment of the system and method increases the dynamic range of the mixer. As explained below, in an original Gilbert multiplier (shown in FIG. 1), the transistors associated with a variable that symbolizes the positive side of a second balanced input (y shown in FIG. 1) need to have a linear characteristic. The scaled current sources (B5 and B6 shown in FIG. 1), however, have an exponential characteristic. In addressing this problem, Gilbert used emitter degeneration resistors in the emitters of these two transistors to approximate a linear characteristic. This approximation compromised the original circuit as an ideal multiplier. The above-threshold transistors of the CNT mixer provided by an embodiment of the system and method are inherently linear and thus fulfill the operation of an ideal multiplier that Gilbert had in theory but was not able to achieve in practice.

FIG. 1 illustrates active devices B1-B4, e.g., bipolar junction transistors (BJTs), in an original Gilbert multiplier circuit 100. The emitter of B1 is connected to the emitter of B2; and the emitter of B3 is connected to the emitter of B4. The collector of B1 is connected to the collector of B3; and the collector of B2 is connected to the collector of B4. The base of B2 is connected to the base of B3. The base of B1 and B4 is shown as x, which symbolizes the positive side of a first balanced input. The base of B2 and B3 is shown as (1−x), which symbolizes the negative side of a first balanced input. The active devices B1-B4 have an exponential control characteristic, $I_c = I_s \exp(qV_{BE}/kT)$, where $I_c$ is collector current; $I_s$ is saturation current; $\exp(x)$ is $e^x$, base e, where e is 2.718; q is the charge of the electron, $1.602 \times 10^{-19}$ C; $V_{BE}$ is base emitter voltage; k is Boltzmann's constant, $1.38 \times 10^{-23}$ J/K; and T is temperature in degrees Kelvin.

Figure 2:
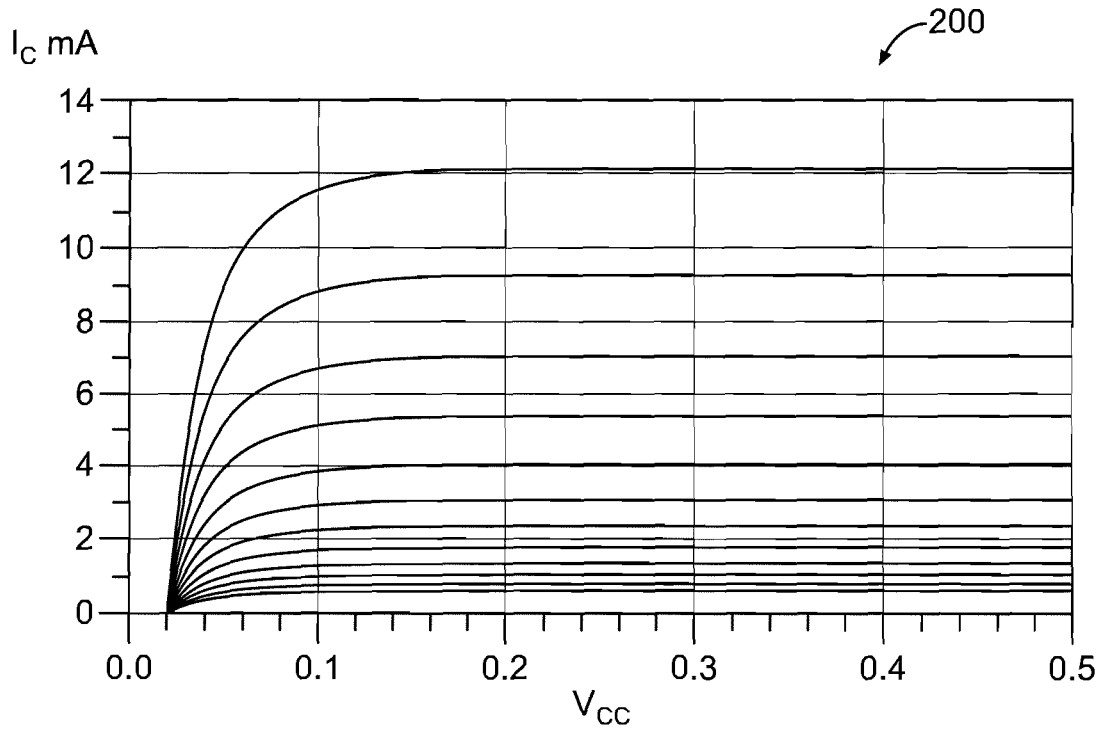
FIG. 2 is an exemplary chart illustrating the simulation of a BJT with base voltage steps, showing the required exponential control characteristic of a Gilbert multiplier circuit.

Two scaled current sources B5-B6 are shown in FIG. 1, providing current as $yI_E$ and $(1-y)I_E$, respectively, where y symbolizes the positive side of a second balanced input and (1−y) symbolizes the negative side of a second balanced input, and $I_E$ is emitter current. These two scaled current sources, which are not shown as active devices, have a linear control characteristic, I=gmV, where gm is transconductance, and V is voltage. The exponential and linear control characteristics are mathematical requirements. If a device with a square root or square law characteristic is substituted for Gilbert's BJTs, the circuit will not work as a multiplier. For example, if a square root characteristic is substituted for the exponential control characteristic, the result is not just a distortion of Z=XY but is a different function, and no amount of compensation can restore the multiplier to a pure XY product. FIG. 2 is an exemplary chart 200 illustrating the simulation of a BJT with base voltage steps, showing the required exponential control characteristic of a Gilbert multiplier circuit.

| Exponential | Square Root | Linear |
| --- | --- | --- |
| I = exp(V) | I = kV$^{1/2}$ | I = gmV |
| Z = XY | Z = XY/(Y$^2$ − 1) | Z = 0 |

An ideal multiplier used as a mixer with sinusoidal RF and local oscillator inputs will produce sum and difference frequencies without any inter-modulation products. Multiple RF signals input into the ideal multiplier will produce sum and difference frequencies with respect to the local oscillator without any inter-modulation products. As described below, an embodiment of the system and method modifies the Gilbert multiplier circuit to provide an ideal multiplier.

A CNT device behaves as an enhancement mode field-effect transistor (FET) and has two regions of operation: 1) above-threshold and 2) sub-threshold. In the above-threshold region, the drain to source voltage is greater than the gate to source voltage, which is greater than 4 kT/q (i.e., $V_{DS} > V_{GS} > 4$ kT/q, where $V_{DS}$ is drain to source voltage, and $V_{GS}$ is gate to source voltage). In the sub-threshold region, the drain to source voltage is greater than 0, and the gate to source voltage is less than kT/q (i.e., $V_{DS} > 0$ and $V_{GS} < kT/q$ (including negative values)).

Figure 3A:
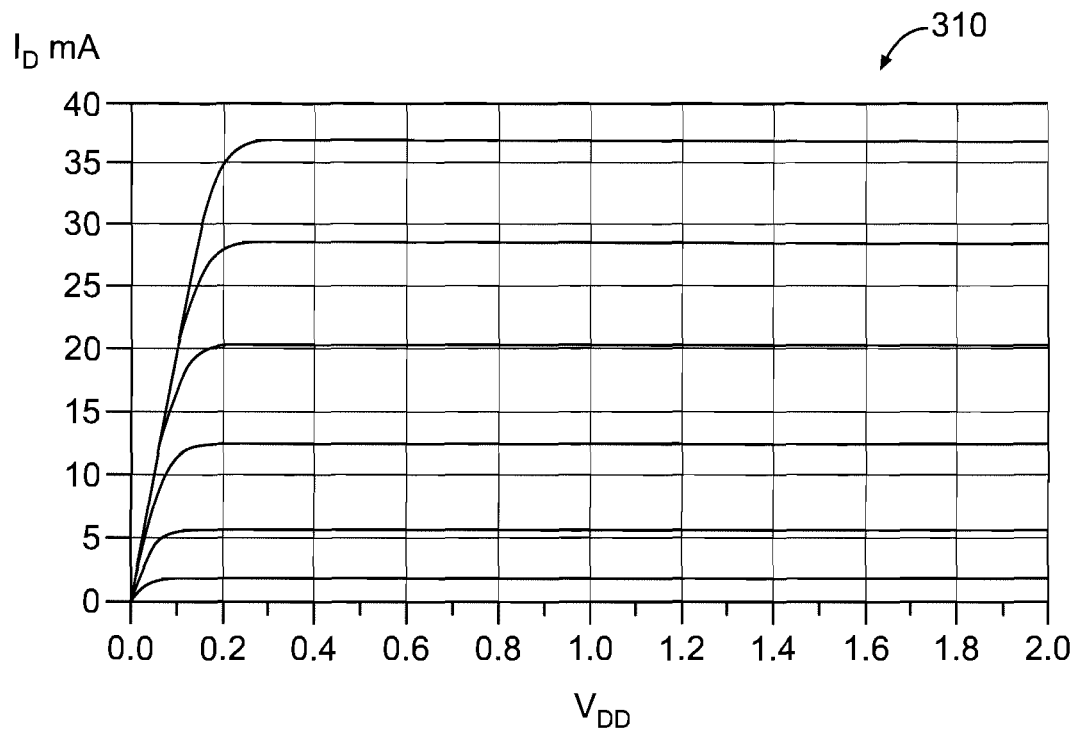
FIG. 3A is an exemplary chart illustrating current-voltage (I-V) characteristics in the above-threshold region of a CNT device.

FIG. 3A is an exemplary chart 310 illustrating current-voltage (I-V) characteristics in the above-threshold region of a CNT device. The I-V characteristics are in saturation (i.e., $I_d$ levels off for $V_{DS} > 0.3$ V) and have uniform gate steps as determined by physics constants (i.e., perfectly linear).

Figure 3B:
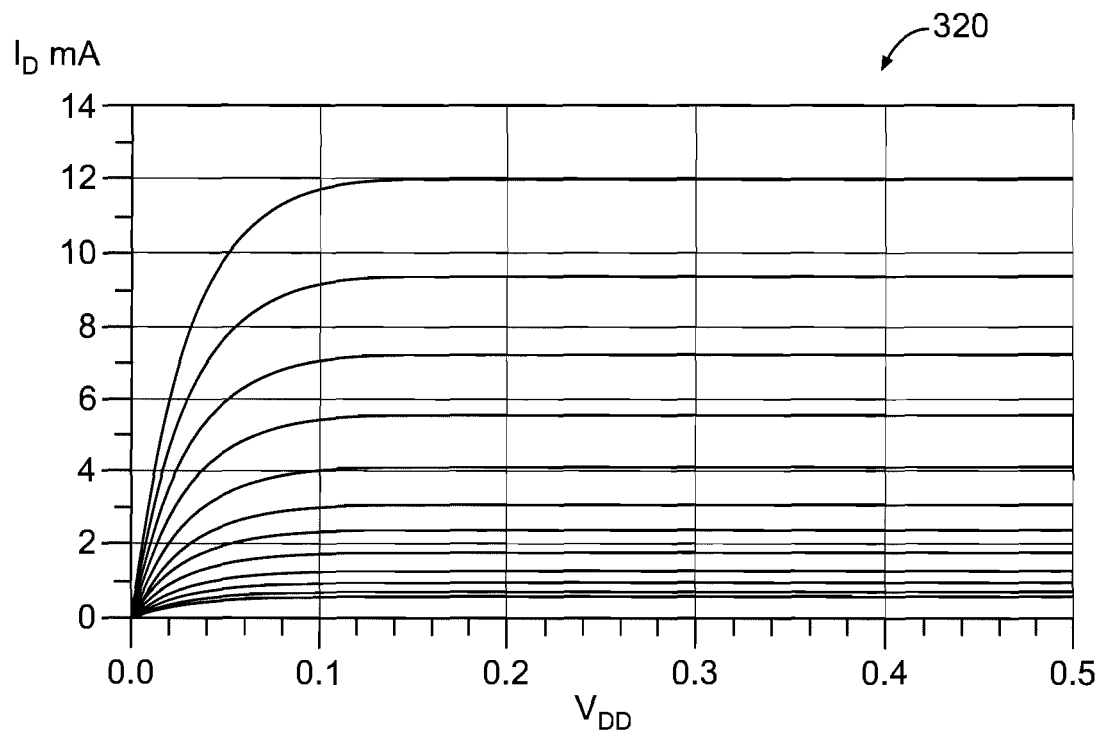
FIG. 3B is an exemplary chart illustrating I-V characteristics in the sub-threshold region of a CNT device.

FIG. 3B is an exemplary chart 320 illustrating I-V characteristics in the sub-threshold region of a CNT device. The I-V characteristics are also in saturation but have gate steps that vary exponentially, also determined by physics constants.

The CNT device of FIG. 3B can be scaled up in size and used in the sub-threshold region, and compares favorably to the BJT characteristics of FIG. 2.

A CNT device has unique I-V characteristics as given by equation (1) which is further described in Baumgardner et al, "Inherent linearity in CN FETs," *Appl. Phys. Lett.* 91, 05-21-07, which is incorporated herein by reference.

$$I_D = N \frac{4q^2}{h} \frac{kT}{q} \{\ln(1 + \exp(q(V_{GS} - \Delta)/kT)) - \ln(1 + \exp(q(V_{GS} - V_{DS} - \Delta)/kT))\} \quad (1)$$

N is the number of tubes, typically in the hundreds or thousands, $\Delta$ is half the band gap, and h is Planck's constant, $6.63 \times 10^{-34}$ J/Hz. Equation (1) shows that when the arguments of the exponentials are greater than zero, linear device operation occurs because logarithm base e (ln) of an exponential is linear. When the arguments of the exponentials are less than zero, exponential device operation occurs because $\ln(1+\in)=\in$ for small $\in$, where in this case E is the exponential.

The I-V characteristics of FIGS. 3A and 3B are generated with a large-signal model in, for example, the Advanced Design System (ADS) by Agilent Technologies Inc. In addition to the I-V curves of equation (1), the large-signal model may include non-ideal effects, such as channel length and low-K gate dielectric constant, where transconductance (gm) is lower by a scale factor but still maintains its functional (linear) form. These non-ideal effects are described below as having no effect on linearity.

As shown in equation (2), the factor $1+L/Lm$, where L is the channel length and where Lm is the mean free path, typically 1.4 um (i.e., $10^{-6}$ meters), is added to the current control equation.

$$I_D = N \frac{4q^2}{h} V_t \frac{1}{1 + L/Lm} \{\ln(1 + \exp((V_{GS} - \Delta)/V_t)) - \ln(1 + \exp((V_{GS} - V_{DS} - \Delta)/V_t))\} \quad (2)$$

Vt is the thermal voltage, kT/q. This effect typically reduces gm by a factor of 3 to 10, but does not affect linearity.

The CNT has the unique situation where access to the gate control node is not possible. This is analogous to a pseudomorphic high electron mobility transistor (PHEMT) that has a capacitance in series with the gate but direct access to the gate is not available.

Figure 4:
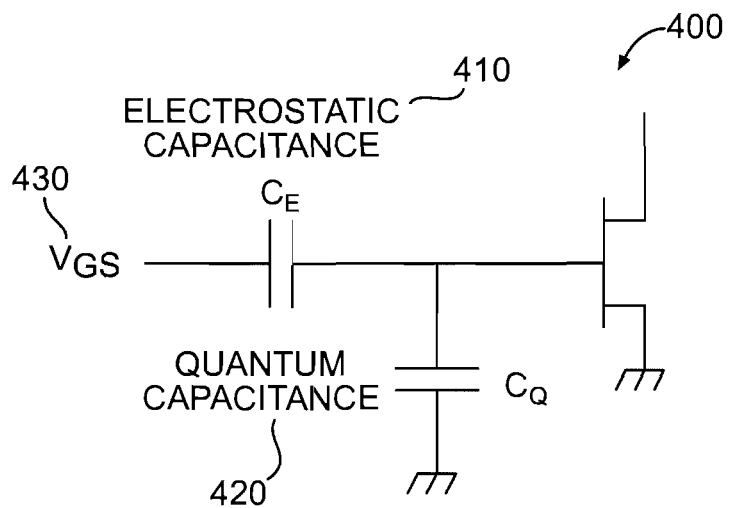
FIG. 4 illustrates an exemplary CNT with a small total input capacitance determined by the combination of two capacitances, i.e., an electrostatic capacitance $C_E$ and a quantum capacitance $C_Q$.

FIG. 4 illustrates an exemplary CNT 400 with a small total input capacitance determined by the combination of two capacitances, i.e., an electrostatic capacitance $C_E$ and a quantum capacitance $C_Q$. To the extent the electrostatic capacitance $C_E$ is comparable to the quantum capacitance $C_Q$ there is a voltage divider that produces an effective gm that is reduced in value by the voltage divider ratio. Equation (3) provides what the quantum capacitance $C_Q$ is.

$$C_{quantum} = \frac{\delta Q}{\delta V_u} = \frac{4q^2}{h \nu_F} \frac{V_u}{\sqrt{V_u^2 - (\Delta/q)^2}} \quad (3)$$

$V_u$ is the voltage at the inaccessible gate control node. At high gate bias, $V_u > \Delta$, the nanotube capacitance asymptotically approaches the constant, $C_Q = 4q^2/(hV_F) = 175$ aF/um where $\upsilon_F$ is the Fermi velocity, 8.8E5 m/s; aF is atto Farads, $10^{-18}$ Farads; and um is $10^{-6}$ meters.

The electrostatic capacitance $C_E$ is determined by the relation of a wire over a ground plane where the wire is the CNT, according to equation (4).

$$C_E = \frac{2\pi k \varepsilon_0}{\ln(2t/d)} \quad (4)$$

The electrostatic capacitance $C_E$ is comparable to or, in some cases, smaller than the quantum capacitance $C_Q$ and this reduces gm. The external metal gate electrode of the electrostatic capacitance $C_E$ may influence the charge on the CNT, but the CNT itself is not accessible. The large-signal model includes this effect by computing the electrostatic capacitance $C_E$ and the quantum capacitance $C_Q$, and their ratio, which determines the effective gm.

The Gilbert multiplier may provide a perfect Z=XY, where Z is the output and X, Y are two inputs. If such a circuit can be realized there will be no inter-modulation products. As discussed above, the perfect implementation of a Gilbert multiplier may require two types of devices: one type with an exponential control characteristic, and one with a perfectly or near perfect linear control characteristic. As also discussed above, CNT devices have two regions of operation and may provide near perfect linearity as a mixer.

An embodiment of the system and method for providing a CNT mixer with a low local oscillator power requirement and no inter-modulation products modifies the Gilbert multiplier circuit 100 of FIG. 1 to provide an ideal multiplier. Specifically, an embodiment of the system and method replaces BJTs B1-B4 of FIG. 1 with relatively large periphery CNT devices in the sub-threshold region for one part of the Gilbert multiplier circuit 100 to achieve the exponential control characteristic and replaces the scaled current sources B5-B6 of FIG. 1 with relatively small periphery CNT devices in the above-threshold region for another part of the Gilbert multiplier circuit 100 to achieve the linear control characteristic, resulting in an ideal multiplier that has a low local oscillator power requirement and virtually no inter-modulation products.

Figure 5:
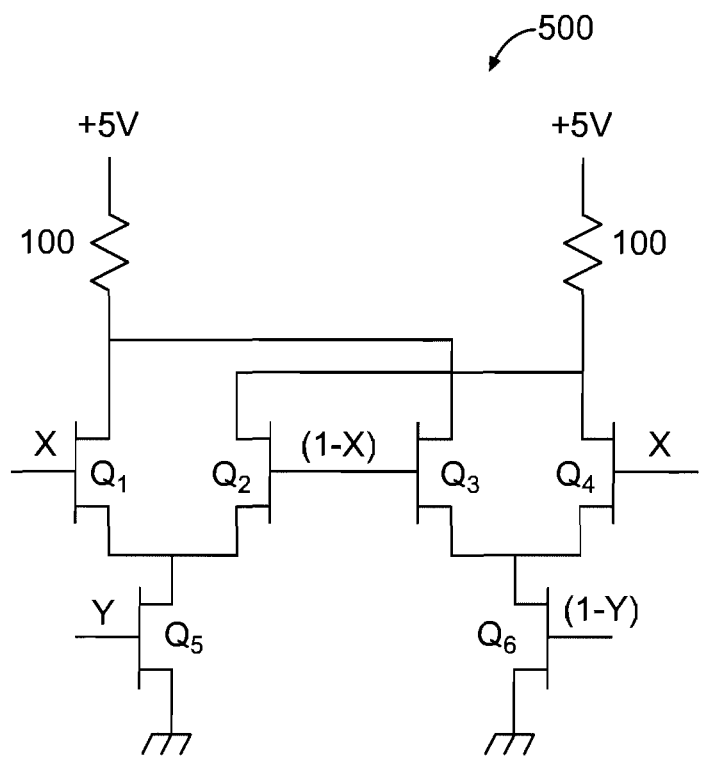
FIG. 5 illustrates an exemplary modified Gilbert multiplier circuit implementing an embodiment of the system and method for providing a CNT mixer with a low local oscillator power requirement and no inter-modulation products.

FIG. 5 illustrates an exemplary modified Gilbert multiplier circuit 500 implementing an embodiment of the system and method for providing a CNT mixer with a low local oscillator power requirement and no inter-modulation products. Four sub-threshold CNT devices Q1-Q4 replace the BJTs B1-B4 of FIG. 1. The sub-threshold CNT devices Q1-Q4 are two cross-coupled differential pairs of CNT devices (also referred to as cross-coupled quadruples) with relatively large periphery of channel widths. The source of Q1 is connected to the source of Q2; and the source of Q3 is connected to the source of Q4. The drain of Q1 is connected to the drain of Q3; and the drain of Q2 is connected to the drain of Q4. The gate of Q2 is connected to the gate of Q3. The gate of Q1 and Q4 is shown as x, which symbolizes the positive side of a first balanced input. The gate of Q2 and Q3 is shown as (1−x), which symbolizes the negative side of a first balanced input.

The sub-threshold CNT devices Q1-Q4 have an exponential control characteristic, $$I_D = N \frac{4e^2}{h} V_t \frac{1}{1+L/Lm} \exp((V_{GS} - \Delta)/V_t)).$$

With continued reference to FIG. 5, two above-threshold CNT devices Q5-Q6 replace the scaled current sources B5-B6 of FIG. 1, providing tail current $yI_E$ and $(1-y)I_E$, respectively, where y symbolizes the positive side of a second balanced input and (1−y) symbolizes the negative side of a second balanced input, and $I_E$ is emitter current. The above-threshold CNT devices Q5-Q6 (also referred to as two tail-current CNT devices) may be linear transconductance transistors with relatively small periphery of channel widths. The above-threshold CNT devices Q5-Q6 have a linear control characteristic, I=gmV, where gm is transconductance, and V is voltage.

The relatively large periphery of some of the CNT devices relative to the small periphery of the other CNT devices may be detected when comparing mixers made by different vendors. Since the sub-threshold CNT devices Q1-Q4 are in series with the above-threshold CNT devices Q5-Q6, they pass the same current. The ratio (i.e., scale factor) of channel widths may determine which devices will be above-threshold and which devices will be sub-threshold. In an embodiment, the sub-threshold CNT devices Q1-Q4 (i.e., cross-coupled quadruple transistors) are 10× wider in channel widths than the above-threshold CNT devices Q5-Q6 (i.e., linear transconductance transistors). This ratio may be observed with a low-power, stereo-zoom microscope. One skilled in the art will appreciate that other ratios can equally be applied.

An embodiment of the system and method uses a mathematical approach, implementing a multiplication of Z=XY. If X=sin A and Y=sin B, then the multiplication XY produces sin A−B and sin A+B where the sum component, sin A+B, is easily separated in frequency from the intermediate frequency (IF). For example, if two RF frequencies are input into the modified Gilbert multiplier circuit 500, X=sin A1+sin A2, then XY includes only sin A1−B+sin A1+B and sin A2−B+sin A2+B with no other frequency components in the output. Thus the multiplier technique does not need the local oscillator to dominate the RF. A mixing action with high IP3 can therefore be obtained with a low amount of local oscillator power. Further, the exemplary modified Gilbert multiplier circuit 500 generates virtually no inter-modulation products because of the modified Gilbert multiplier circuit 500 represents Z=XY, which is not mathematically capable of generating inter-modulation products.

Figure 6A:
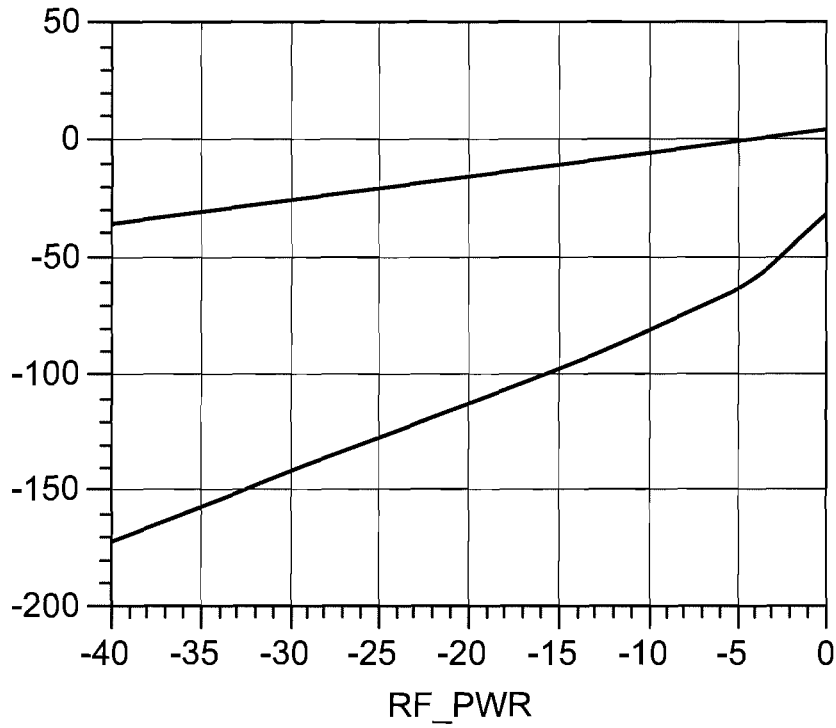
FIGS. 6A and 6B illustrate simulation results of the exemplary modified Gilbert multiplier circuit of FIG. 5.
Figure 6B:
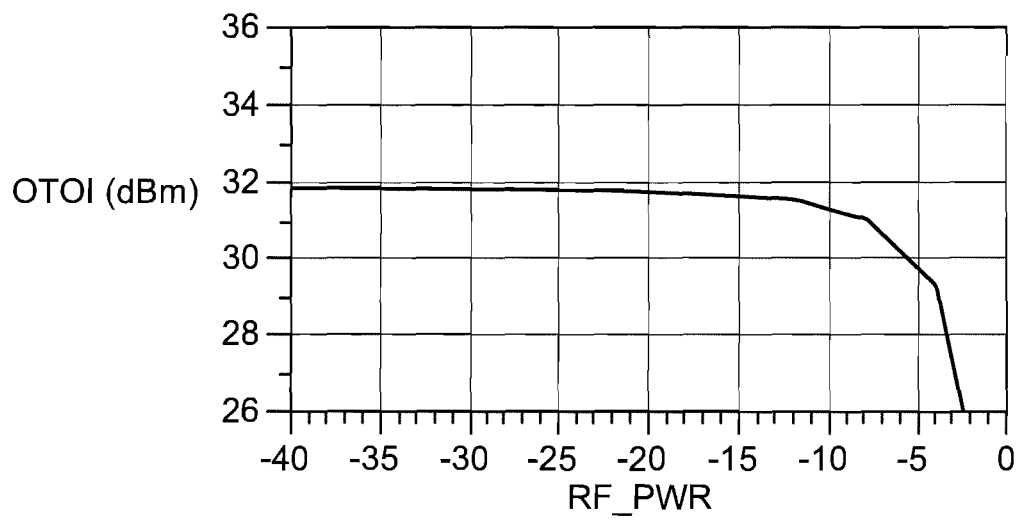

FIGS. 6A and 6B illustrate simulation results of the exemplary modified Gilbert multiplier circuit 500 of FIG. 5. A large-signal model for the CNT devices is used to simulate the mixer (i.e., multiplier) performance. The CNT devices are scaled and biased as shown in FIG. 5B. Scaling means that Q1-Q4 are larger in periphery compared to Q5-Q6, and biasing means that the current flow through Q1 and Q2 sums to the current flow through Q5, and the current flow through Q3 and Q4 sums to the current flow through Q6. If the Gilbert criteria are met, very low inter-modulation products result due to the mathematically ideal multiplier. The simulation results shown in FIGS. 6A and 6B confirm that very low inter-modulation products result. Specifically, a 31.8 dBm (decibels relative to a milliwatt, 10 log P/0.001) output intercept point is obtained with very little local oscillator power of 0 dBm. FIG. 6A shows the 3:1 slope of the inter-modulation products that projects to 31.8 dBm. FIG. 6B shows that the output intercept point is flat over a wide range of RF power level. The simulation of FIGS. 6A and 6B is done over a range of power and frequency and no null points have contributed to the 31.8 dBm intercept point. Because the exemplary modified Gilbert multiplier circuit 500 meets the exponential and linear control characteristics, the amount of local oscillator power needed is low.

Figure 7:
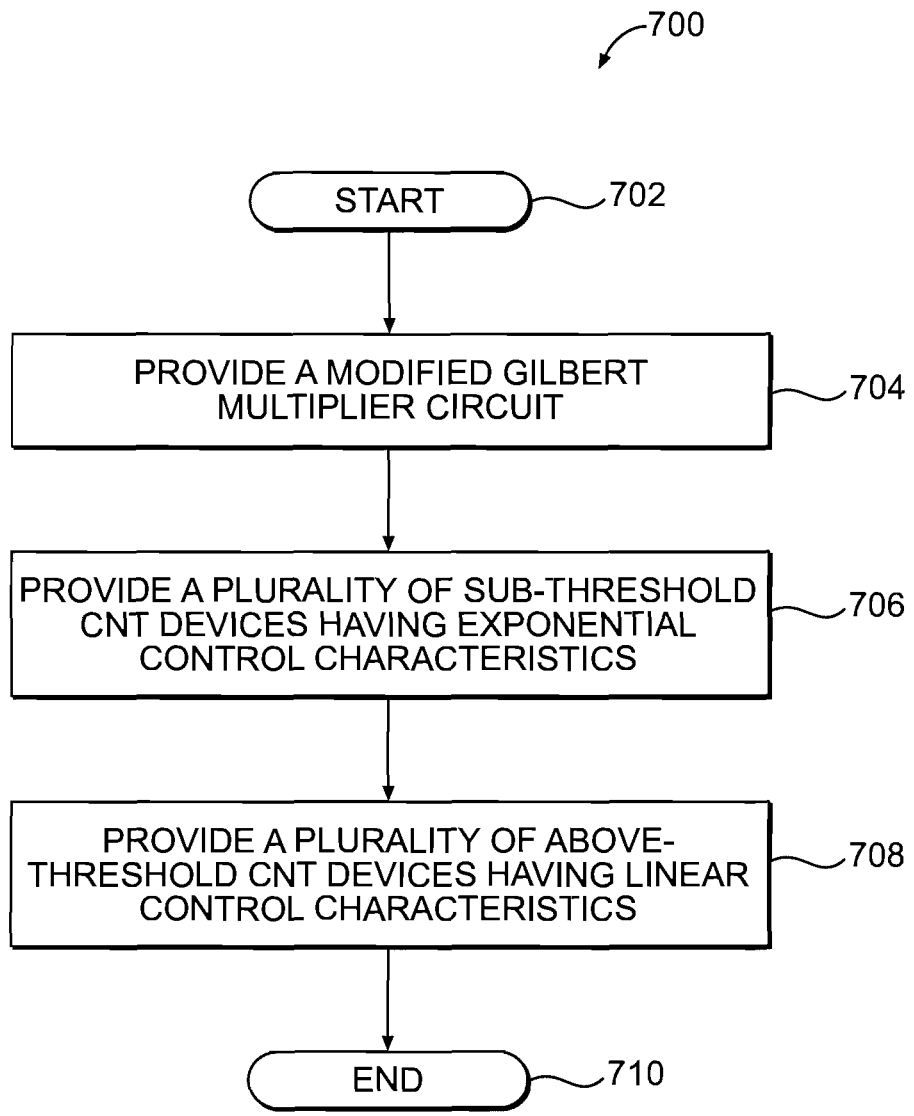
FIG. 7 is a flow chart illustrating a method for providing a CNT mixer with a low local oscillator power requirement and no inter-modulation products.

FIG. 7 is a flow chart illustrating a method 700 for providing a CNT mixer with a low local oscillator power requirement and no inter-modulation products. The method starts (block 702) by providing a modified Gilbert multiplier circuit (block 704), which includes providing a plurality of sub-threshold CNT devices having exponential control characteristics (block 706), and providing a plurality of above-threshold CNT devices having linear control characteristics (block 708). The plurality of sub-threshold CNT devices are scaled up by a scale factor so that the plurality of sub-threshold CNT devices have relatively large periphery of channel widths and the plurality of above-threshold CNT devices have relatively small periphery of channel widths. The method ends at block 710.

In summary, two different functions exist within a Gilbert multiplier circuit; two operating regions of a CNT exist; and the required scaling appropriate for the two operating regions is different. These three concepts allow the mathematical requirements of the Gilbert multiplier to be fulfilled. Once these are met, an ideal multiplier may be created to allow the mixing of a local oscillator and an RF with virtually no inter-modulation products.

Table 1 shows the mixer performance of the exemplary modified Gilbert multiplier circuit 500 of FIG. 5 compared with current mixers.

TABLE 1

|  | Output IP3 | Local oscillator |
|---|---|---|
| CMOS resistive FET mixer: (e.g., Peregrine P/N PE4140) | 24 dBm | 17 dBm |
| Diode mixer: (e.g., Marki P/N T3-03MQ) | 30 dBm | 25 dBm |
| Modified multiplier circuit of FIG. 5 | 30 dBm | 0 dBm |

The current mixers can be described in terms of the local oscillator power needed to achieve an output third-order intercept point (IP3) where it is desirable to have lower local oscillator power. A current mixer output IP3 of 30 dBm typically requires a local oscillator power of 23 to 25 dBm. An embodiment of the system and method for providing a CNT mixer with a low local oscillator power requirement and no inter-modulation products allows a mixer output IP3 of 30 dBm with an local oscillator power of 0 dBm. This reduces the number of chips in and the power consumption of a radar system or a hand-held radio. It also allows mixers to be placed in transmit/receive modules. An embodiment of the system and method can be used in radar receivers and communications receivers.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:

1. A system for providing a carbon nanotube transistor (CNT) mixer with a low local oscillator power requirement and virtually no inter-modulation products, comprising:
a modified Gilbert multiplier circuit comprising:
a plurality of sub-threshold CNT devices having exponential control characteristics; and
a plurality of above-threshold CNT devices having linear control characteristics,
wherein the plurality of sub-threshold CNT devices are increased in periphery by a scale factor so that the plurality of sub-threshold CNT devices have relatively large periphery of channel widths and the plurality of above-threshold CNT devices have relatively small periphery of channel widths.

2. The system of claim 1, wherein the scale factor of the plurality of sub-threshold CNT devices to the plurality of above-threshold CNT devices is 10×.

3. The system of claim 1, wherein the plurality of sub-threshold CNT devices are two cross-coupled differential pairs of CNT devices.

4. The system of claim 1, wherein the plurality of above-threshold CNT devices are linear transconductance transistors.

5. The system of claim 1, wherein the CNT mixer generates very little inter-modulation products because the modified Gilbert multiplier circuit represents Z=XY that is not mathematically capable of generating inter-modulation products.

6. The system of claim 1, wherein the modified Gilbert multiplier circuit implements a multiplication of Z=XY, wherein X=sin A and Y=sin B, wherein a multiplication XY produces sin A−B and sin A+B where a sum component, sin A+B, is easily separated in frequency from an intermediate frequency (IF), thereby a mixing action with high third-order intercept point (IP3) is obtained with a low amount of local oscillator power.

7. The system of claim 1, wherein the periphery of channel widths of the plurality of sub-threshold CNT devices are multiple times greater than the periphery of channel widths of the plurality of above-threshold CNT devices.

8. The system of claim 1, wherein the plurality of sub-threshold CNT devices are positioned at an upper portion of the modified Gilbert multiplier circuit, and wherein the plurality of above-threshold CNT devices are positioned at a lower portion of the modified Gilbert multiplier circuit.

9. The system of claim 8, wherein the plurality of sub-threshold CNT devices are in series with the above-threshold CNT devices.

10. A method for providing a carbon nanotube transistor (CNT) mixer with a low local oscillator power requirement and virtually no inter-modulation products, comprising:
providing a modified Gilbert multiplier circuit, comprising:
providing a plurality of sub-threshold CNT devices having exponential control characteristics; and
providing a plurality of above-threshold CNT devices having linear control characteristics,
wherein the plurality of sub-threshold CNT devices are increased in periphery by a scale factor so that the plurality of sub-threshold CNT devices have relatively large periphery of channel widths and the plurality of above-threshold CNT devices have relatively small periphery of channel widths.

11. The method of claim 10, wherein the scale factor of the plurality of sub-threshold CNT devices to the plurality of above-threshold CNT devices is 10×.

12. The method of claim 10, wherein the providing the plurality of sub-threshold CNT devices includes providing two cross-coupled differential pairs of CNT devices.

13. The method of claim 10, wherein the providing the plurality of above-threshold CNT devices includes providing linear transconductance transistors.

14. The method of claim 10, wherein the periphery of channel widths of the plurality of sub-threshold CNT devices are multiple times greater than the periphery of channel widths of the plurality of above-threshold CNT devices.

15. The method of claim 10, wherein the plurality of sub-threshold CNT devices are positioned at an upper portion of the modified Gilbert multiplier circuit, and wherein the plurality of above-threshold CNT devices are positioned at a lower portion of the modified Gilbert multiplier circuit.

16. The method of claim 15, wherein the plurality of sub-threshold CNT devices are in series with the above-threshold CNT devices.

17. A carbon nanotube transistor (CNT) mixer with a low local oscillator power requirement and virtually no inter-modulation products, comprising:
a modified Gilbert multiplier circuit comprising:
a plurality of sub-threshold CNT devices having exponential control characteristics; and
a plurality of above-threshold CNT devices having linear control characteristics,
wherein the plurality of sub-threshold CNT devices are increased in periphery by a scale factor so that the plurality of sub-threshold CNT devices have relatively large periphery of channel widths and the plurality of above-threshold CNT devices have relatively small periphery of channel widths.

18. The CNT mixer of claim 17, wherein the scale factor of the plurality of sub-threshold CNT devices to the plurality of above-threshold CNT devices is 10×.

19. The CNT mixer of claim 17, wherein the CNT mixer generates very little inter-modulation products because the modified Gilbert multiplier circuit represents Z=XY that is not mathematically capable of generating inter-modulation products.

20. The CNT mixer of claim 17, wherein the modified Gilbert multiplier circuit implements a multiplication of Z=XY, wherein X=sin A and Y=sin B, wherein a multiplication XY produces sin A−B and sin A+B where a sum component, sin A+B, is easily separated in frequency from an intermediate frequency (IF), thereby a mixing action with high third-order intercept point (IP3) is obtained with a low amount of local oscillator power.

21. The CNT mixer of claim 17, wherein the periphery of channel widths of the plurality of sub-threshold CNT devices are multiple times greater than the periphery of channel widths of the plurality of above-threshold CNT devices.

22. The CNT mixer of claim 17, wherein the plurality of sub-threshold CNT devices are positioned at an upper portion of the modified Gilbert multiplier circuit, and wherein the plurality of above-threshold CNT devices are positioned at a lower portion of the modified Gilbert multiplier circuit.

23. The CNT mixer of claim 22, wherein the plurality of sub-threshold CNT devices are in series with the above-threshold CNT devices.

* * * * *